(12) United States Patent
Kinoshita et al.

(10) Patent No.: US 10,600,864 B2
(45) Date of Patent: Mar. 24, 2020

(54) SEMICONDUCTOR DEVICE

(71) Applicant: Fuji Electric Co., Ltd., Kanagawa (JP)

(72) Inventors: Akimasa Kinoshita, Nagano (JP); Keiji Okumura, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/212,148

(22) Filed: Dec. 6, 2018

(65) Prior Publication Data
US 2019/0214457 A1    Jul. 11, 2019

(30) Foreign Application Priority Data
Jan. 9, 2018    (JP) ................. 2018-001512

(51) Int. Cl.
| H01L 29/10 | (2006.01) |
| H01L 29/78 | (2006.01) |
| H01L 29/16 | (2006.01) |
| H01L 29/06 | (2006.01) |
| H01L 21/04 | (2006.01) |
| H01L 29/66 | (2006.01) |
| H01L 21/02 | (2006.01) |

(52) U.S. Cl.
CPC ...... H01L 29/063 (2013.01); H01L 21/02529 (2013.01); H01L 21/046 (2013.01); H01L 21/049 (2013.01); H01L 29/1095 (2013.01); H01L 29/1608 (2013.01); H01L 29/66068 (2013.01); H01L 29/7813 (2013.01)

(58) Field of Classification Search
CPC .............. H01L 29/0619–0623; H01L 29/7813
See application file for complete search history.

(56) References Cited

U.S. PATENT DOCUMENTS

| 2009/0261350 A1 | 10/2009 | Yamamoto et al. |
| 2012/0319136 A1 | 12/2012 | Noborio et al. |
| 2018/0166530 A1* | 6/2018 | Lichtenwalner ............ H01L 29/66734 |

FOREIGN PATENT DOCUMENTS

| JP | 2001-267570 A | 9/2001 |
| JP | 4640439 B2 | 3/2011 |
| JP | 5728992 B2 | 6/2015 |

* cited by examiner

*Primary Examiner* — Daniel P Shook
(74) *Attorney, Agent, or Firm* — Chen Yoshimura LLP

(57) ABSTRACT

A semiconductor device includes: a semiconductor substrate of a first conductivity type; a first semiconductor layer of the first conductivity type; a second semiconductor layer of a second conductivity type; a first semiconductor region of the first conductivity type; a trench; a second semiconductor region of the second conductivity type; a third semiconductor region of the second conductivity type; and a fourth semiconductor region of the first conductivity type. The second semiconductor region is selectively provided inside the first semiconductor layer, and the third semiconductor region is selectively provided inside the first semiconductor layer and contacts a bottom surface of the trench. The fourth semiconductor region is provided perpendicularly to a lengthwise direction of the trench in a plan view and is located at a depth position that is deeper than the second semiconductor region.

10 Claims, 13 Drawing Sheets

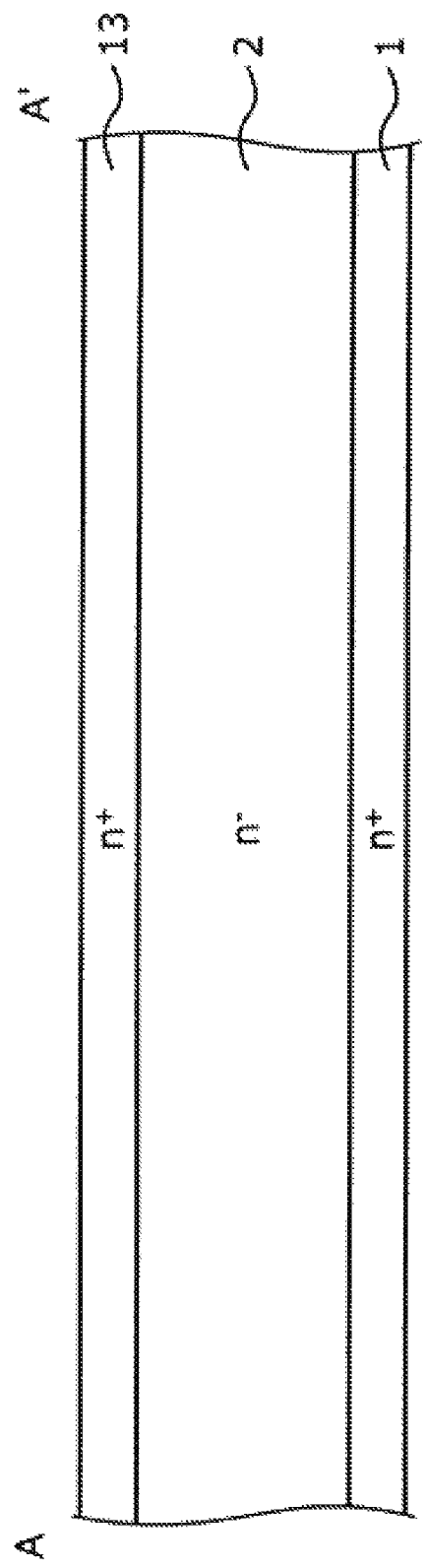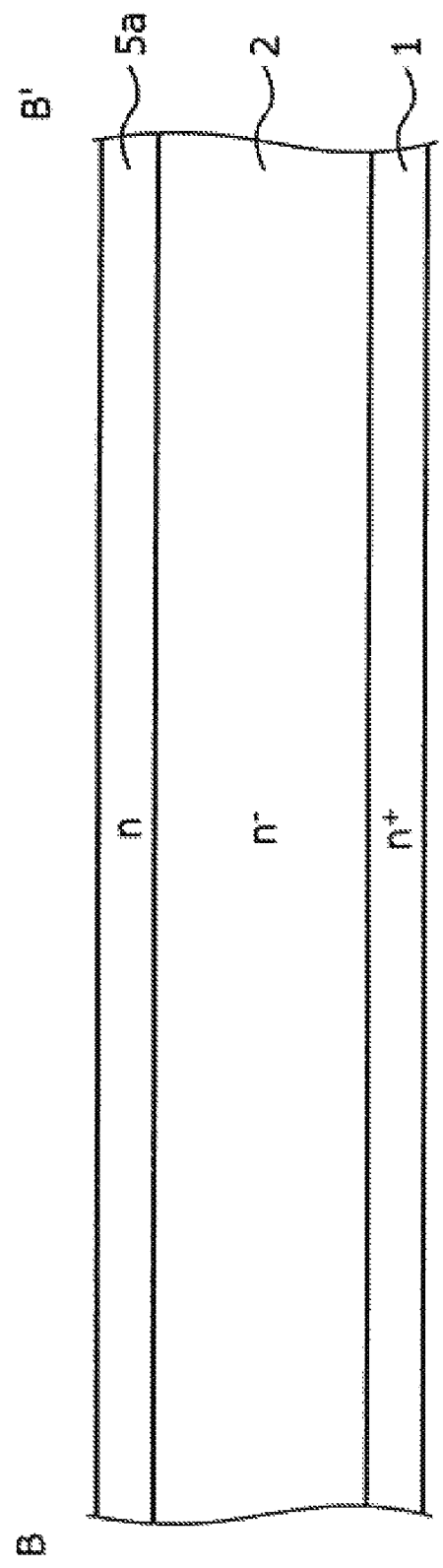

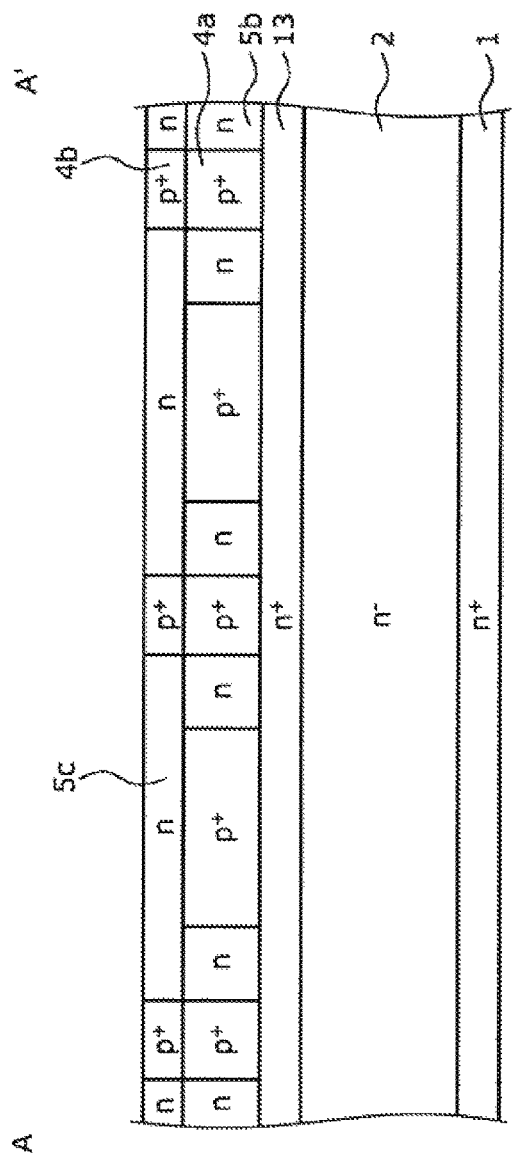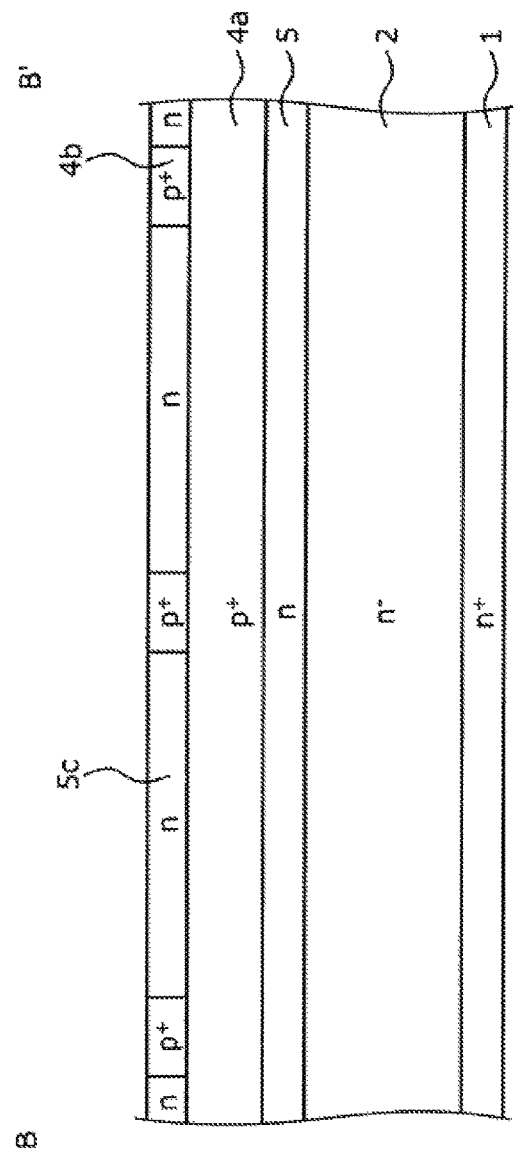

SEMICONDUCTOR DEVICE

BACKGROUND OF THE INVENTION

Technical Field

The present invention relates to a semiconductor device.

Background Art

Conventionally, in order to reduce the ON resistance of elements in a power semiconductor element, vertical MOSFETs (metal oxide semiconductor field effect transistors) having a trench structure have been fabricated (manufactured). In a vertical MOSFET, the cell density per unit area can be increased more with a trench structure in which the channel is formed perpendicularly to the substrate surface than with a planar structure in which the channel is formed parallel to the substrate surface, which makes it possible to increase current density per unit area and is advantageous from a cost perspective.

However, when the trench structure is formed in a vertical MOSFET, the entire trench inner wall is covered with a gate insulating film in order to form the channel in the vertical direction, and the portion of the gate insulating film on the trench bottom approaches the drain electrode, which makes the portion of the gate insulating film on the trench bottom susceptible to having a high electric field applied thereto. In particular, in a wide bandgap semiconductor (a semiconductor with a wider bandgap than silicon, e.g., silicon carbide (SiC)), an ultra-high withstand voltage element is fabricated, and thus adverse effects on the gate insulating film on the gate bottom greatly reduces reliability.

As a method to eliminate such a problem, a technique has been proposed where, in a vertical MOSFET with a trench structure that has a stripe-shaped planar pattern, a stripe-shaped $p^+$ region is provided between the trenches and parallel to the trenches, and a stripe-shaped $p^+$ region is also provided on the trench bottom and parallel to the trenches (for example, see Patent Document 1 below).

FIG. 13 is a cross-sectional view showing the structure of a conventional silicon carbide semiconductor device. The conventional silicon carbide semiconductor device shown in FIG. 13 includes a MOS gate of an ordinary trench gate structure on the front surface side (a p-type base layer 106-side surface) of a semiconductor substrate body 200 made of silicon carbide (hereinafter, silicon carbide substrate body). The silicon carbide substrate body (semiconductor chip) 200 is formed by epitaxially growing, in the stated order, silicon carbide layers that will respectively serve as an $n^-$ drift layer 102 and the p-type base layer 106 on an $n^+$ support substrate 101 made of silicon carbide (hereinafter, $n^+$ silicon carbide substrate).

A first $p^+$ region 103 is selectively provided in the $n^-$ drift layer 102 so as to cover the entire bottom surface of a trench 118. A second $p^+$ region 104 is also selectively provided in the $n^-$ drift layer 102 between adjacent trenches 118 (in the mesa portion). The reference characters 107, 109, 110, and 112 are, respectively, an $n^+$ source region, gate insulating film, gate electrode, and source electrode.

In a vertical MOSFET with the configuration in FIG. 13, the concentration of electric fields on the gate insulating film 109 can be prevented by the first $p^+$ region 103 below the trench 118 and the second $p^+$ region 104 below the p-type base layer 106. In addition, the location where electric field strength is greatest is able to be configured to be the second $p^+$ region 104, and this location can be separated from the gate insulating film 109. This makes it possible to reduce the electric field strength of the gate insulating film 109 during high voltage blocking to prevent dielectric breakdown.

There is also a technique whereby an unbalance such as where current flows in a concentrated manner to a portion of a p-type deep layer during breakdown is prevented by arranging a plurality of linear p-type deep layers, at equal gaps to each other, which extend in a first direction that is inclined at a 45 degree angle to the lengthwise direction of the trenches, and by arranging a plurality of p-type deep layers, at equal gaps to each other, which extend in a second direction that is inclined at a 45 degree angle to the lengthwise direction of the trenches and orthogonal to the first direction (for example, see Patent Document 2 below).

In addition, there is a technique whereby the impurity concentration of a low concentration region in the p-type deep layers is changed in the depth direction and an inversion layer is configured to be formed in a portion of the low concentration region positioned on the side faces and bottom of the trench, thereby making it possible for current flowing through the channel to also flow through the inversion layer formed in the low concentration region, thus reducing ON resistance (for example, see Patent Document 3 below).

RELATED ART DOCUMENTS

Patent Documents

Patent Document 1: Japanese Patent Application Laid-Open Publication No. 2001-267570
Patent Document 2: Japanese Patent No. 4640439
Patent Document 3: Japanese Patent No. 5728992

SUMMARY OF THE INVENTION

However, in the structure of Patent Document 1 above, the depths of the first $p^+$ region 103 and second $p^+$ region 104 are at the same position, and thus the breakdown voltage is the same, and when an avalanche current flows, current will also flow under the trench 118, in which case electric fields may concentrate at the bottom of the trench 118. Furthermore, if the first $p^+$ region 103 becomes deeper than the second $p^+$ region 104 due to deviations during forming of the first $p^+$ region 103 and second $p^+$ region 104, then it will be easier for avalanche current to flow under the trench 118, and thus electric fields may concentrate at the bottom of the trench 118 and the insulation of the gate insulating film 109 may be destroyed.

Due to this, there are times when an n-type region with a higher impurity concentration than the $n^-$ drift layer 102 contacting the second $p^+$ region 104 is provided below the second $p^+$ region 104. By providing a low-resistance n-type region, the range where current flows is widened, and current is allowed to flow up to a position separated from the trench gate structure, which makes it possible to reduce the electric field concentration at the bottom of the trench 118.

However, when forming the n-type region, there are cases where the formation positions are deviated due to pattern deviations. In this case, there is a problem where the n-type region does not form a pn junction with the second $p^+$ region 104, and electric fields concentrate at the bottom of the trench 118, thus lowering avalanche resistance.

In order to eliminate the aforementioned problem of the conventional techniques, the present invention aims at providing a semiconductor device that does not have pattern deviations of an n-type region and that does not have lowered avalanche resistance.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, a semiconductor device according to the present invention has the following characteristics. In the semiconductor device, a first semiconductor layer of the first conductivity type is provided in a front surface of the semiconductor substrate and has a lower impurity concentration than the semiconductor substrate. A second semiconductor layer of a second conductivity type is provided on a side of the first semiconductor layer opposite to the semiconductor substrate. A first semiconductor region of the first conductivity type is selectively provided inside the second semiconductor layer and has a higher impurity concentration than the semiconductor substrate. A trench is provided going through the first semiconductor region and the second semiconductor layer and reaching the first semiconductor layer. A gate electrode is provided inside the trench with a gate insulating film interposed between the gate electrode and the trench. A second semiconductor region of the second conductivity type is selectively provided inside the first semiconductor layer. A third semiconductor region of the second conductivity type is selectively provided inside the first semiconductor layer and contacts a bottom surface of the trench. A fourth semiconductor region of the first conductivity type is selectively provided inside the first semiconductor layer and has a higher impurity concentration than the first semiconductor layer. In a plan view, the fourth semiconductor region has an elongated shape extending in a direction perpendicular to a lengthwise direction of the trench, and in a depth direction, the fourth semiconductor regions is located at a position deeper than the second semiconductor region.

Furthermore, in the semiconductor device according to the present invention, in the aforementioned invention, the second semiconductor region may be connected to a portion of the third semiconductor region by having a lateral extension towards the trench.

Furthermore, in the semiconductor device according to the present invention, in the aforementioned invention, an upper surface of the fourth semiconductor region may contact a portion of a bottom surface of the second semiconductor region.

In the semiconductor device according to the present invention, in the aforementioned invention, the first semiconductor layer may include a drift layer of the first conductivity type and a current spreading layer of the first conductivity type on the drift layer, the forth semiconductor region may be in a bottom layer of the current spreading layer that is in contact with the drift layer underneath, and the second and third semiconductor regions of the second conductivity type may be both provided in the current spreading layer.

According to the invention described above, the n$^+$ high concentration region (the fourth semiconductor region of the first conductivity type) is provided in the direction perpendicular to the lengthwise direction of the trench at a position that is deeper than the first p$^+$ region (the third semiconductor region of the second conductivity type) and the second p$^+$ region (the second semiconductor region of the second conductivity type). This widens the range where current flows, and allows current to flow up to a position separated from the trench gate structure, which makes it possible to reduce the electric field concentration at the bottom of the trench. Due to this, the withstand voltage of the active section is lowered and thereby the withstanding ability of the semiconductor device is improved. Furthermore, it is possible to eliminate avalanches at the bottom of the trench to lower the load on the trench, and it is possible to improve the reliability of the semiconductor device. In addition, pattern deviations are eliminated, which makes it possible to eliminate products that are defective due to pattern deviations, and it is possible to improve the yield of the manufacturing of semiconductor devices.

The semiconductor device according to the present invention exhibits effect where pattern deviations of the n-type region are eliminated and avalanche resistance is not lowered.

It is to be understood that both the foregoing general description and the following detailed description are exemplary and explanatory, and are intended to provide further explanation of the invention as claimed.

BRIEF DESCRIPTION OF THE DRAWINGS

FIG. 7A is a second cross-sectional view of the silicon carbide semiconductor device according to the embodiment during manufacturing.

FIG. 7B is a third cross-sectional view of the silicon carbide semiconductor device according to the embodiment during manufacturing.

FIG. 9A is a sixth cross-sectional view of the silicon carbide semiconductor device according to the embodiment during manufacturing.

FIG. 9B is a seventh cross-sectional view of the silicon carbide semiconductor device according to the embodiment during manufacturing.

DETAILED DESCRIPTION OF EMBODIMENTS

Figure 1:
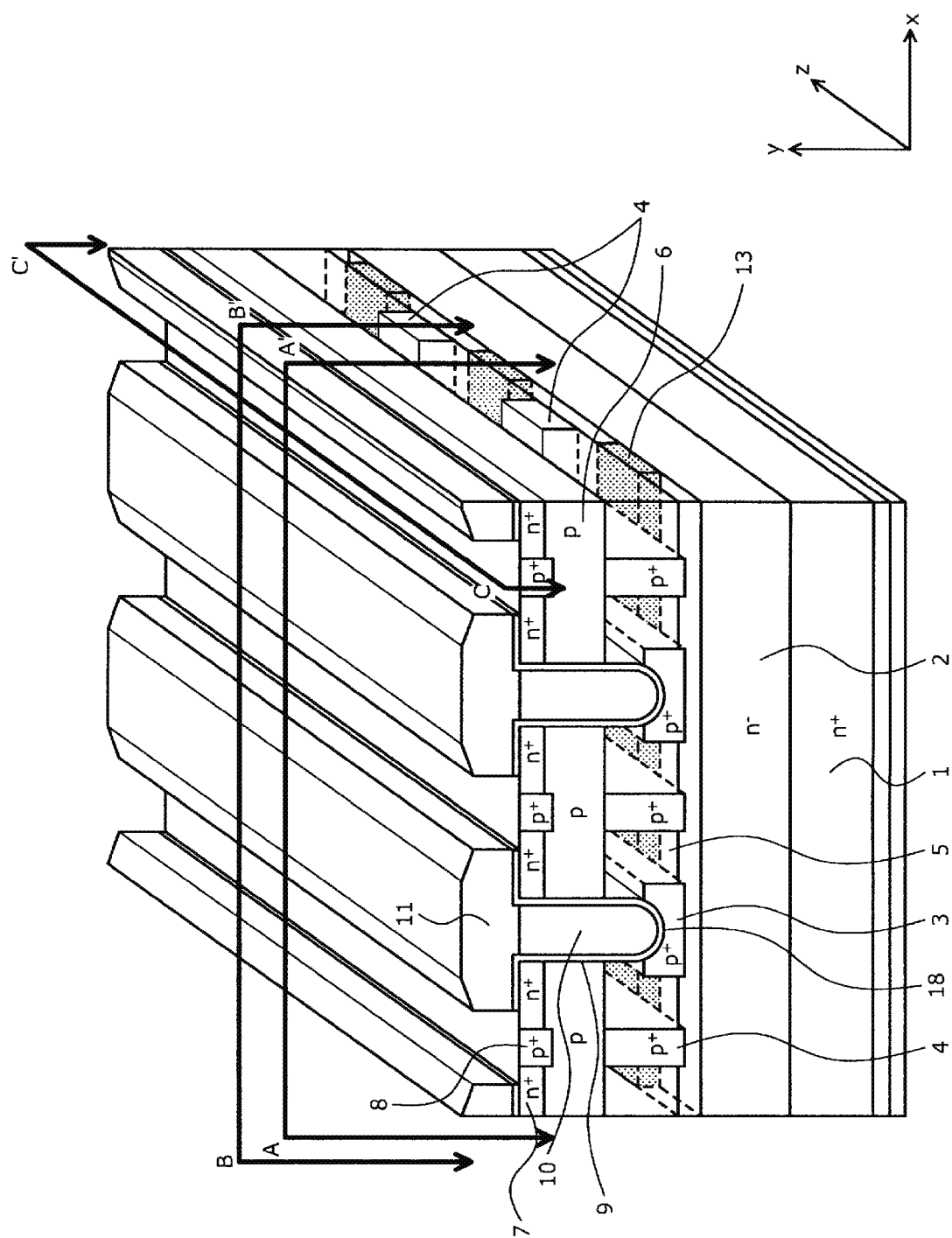
FIG. 1 is a perspective view showing a structure of a silicon carbide semiconductor device according to an embodiment of the present invention.

A preferred embodiment of a semiconductor device according to the present invention will be described in detail below with reference to the attached drawings. In the present specification and attached drawings, electrons or holes are majority carriers in layers or areas marked with an "n" or "p", respectively. The "+" or "−" attached to the "n" or "p" respectively signify higher impurity concentrations and lower impurity concentrations than layers or areas without these marks. The "n" or "p" symbols including the attached "+" or "−" represent similar concentrations to other "n" or "p" symbols including the attached "+" or "−" and do not necessarily represent the same concentrations. In the explanation of the embodiment below and the attached drawings, the same reference characters are attached to similar configurations and repetitive descriptions will be omitted.

(Embodiment)

Figure 2:
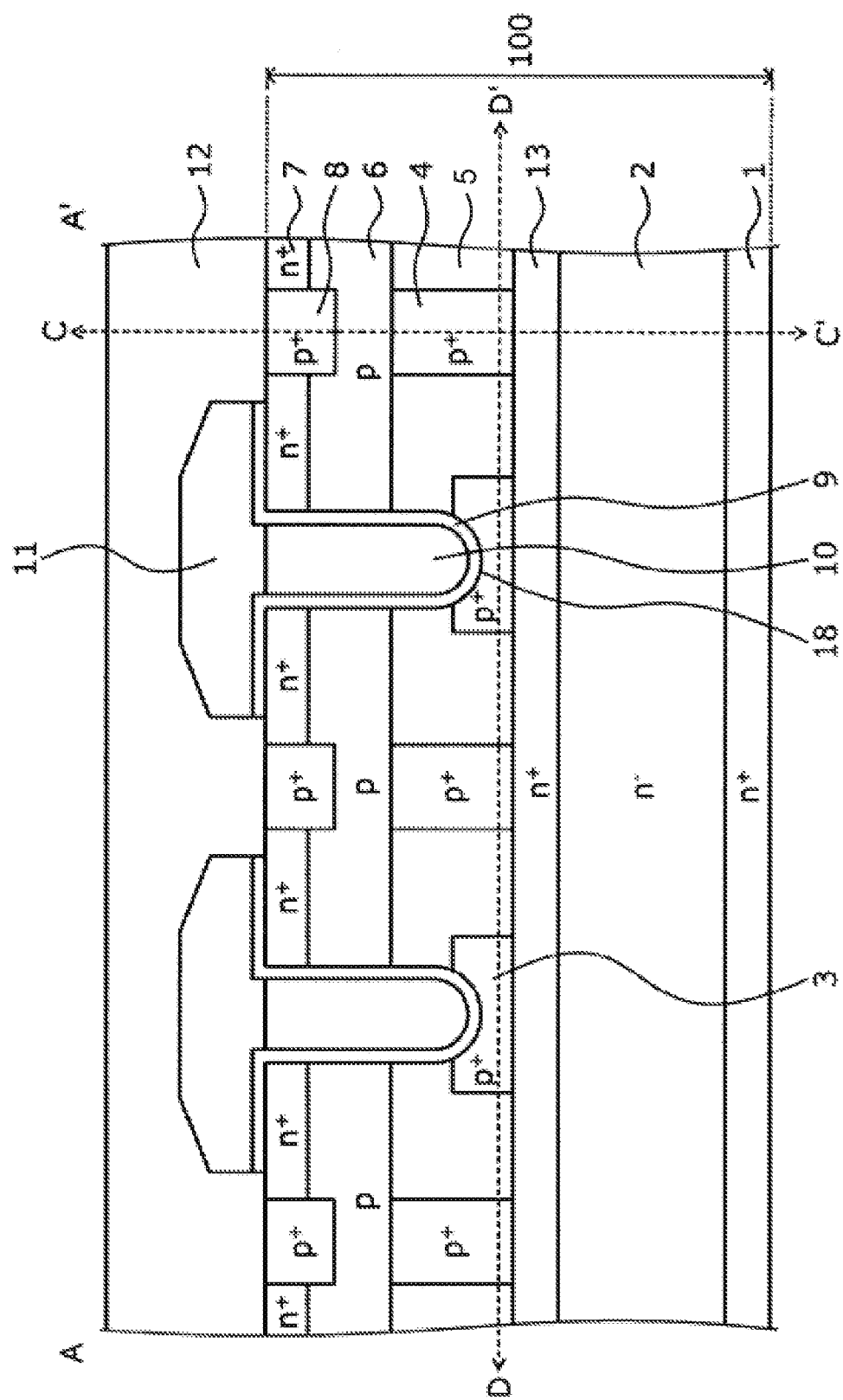
FIG. 2 is a cross-sectional view of the A-A' portion in FIG. 1 that shows the structure of the silicon carbide semiconductor device according to the embodiment.
Figure 3:
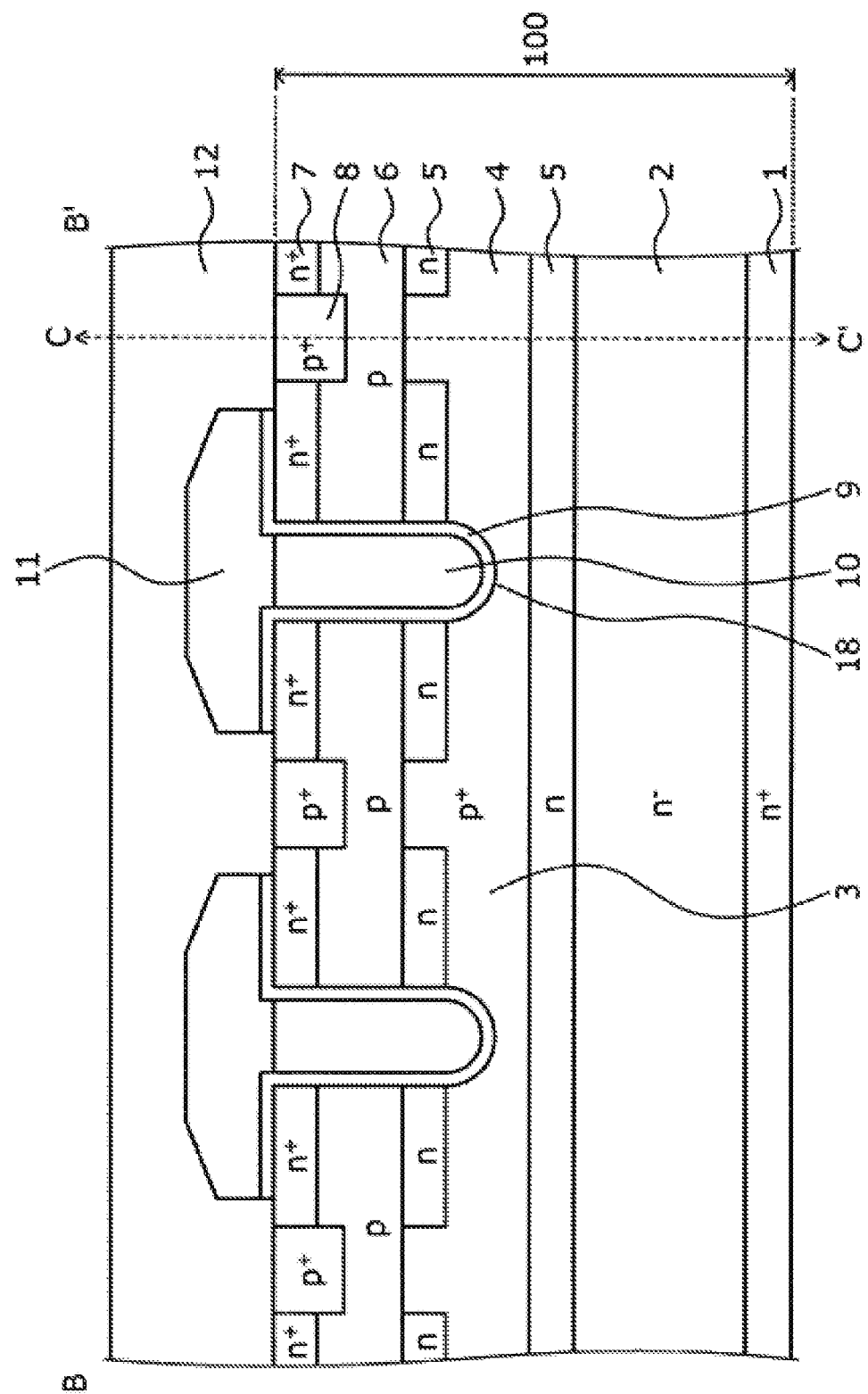
FIG. 3 is a cross-sectional view of the B-B' portion in FIG. 1 that shows the structure of the silicon carbide semiconductor device according to the embodiment.
Figure 4:
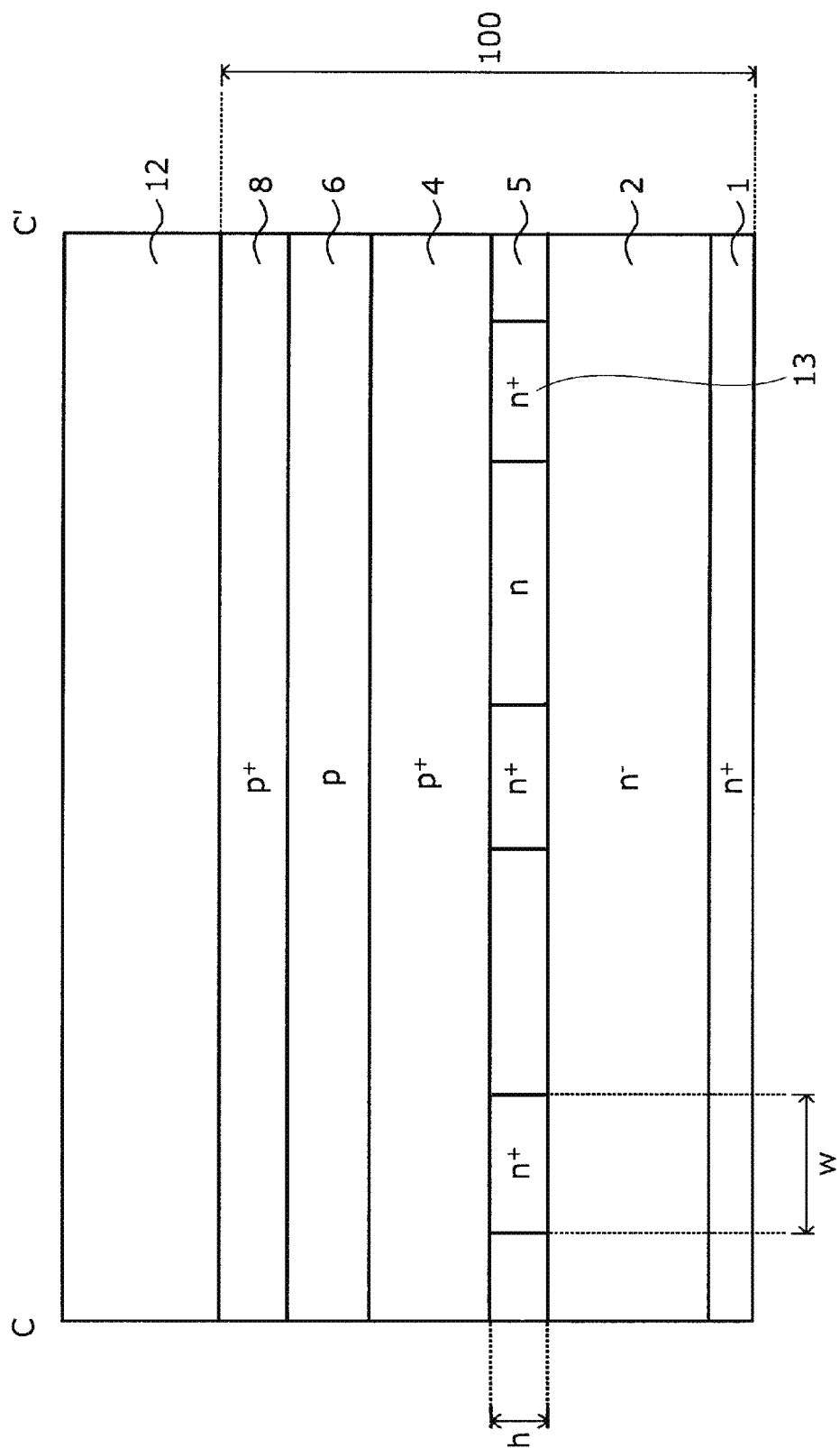
FIG. 4 is a cross-sectional view of the C-C' portion in FIG. 1 that shows the structure of the silicon carbide semiconductor device according to the embodiment.
Figure 5:
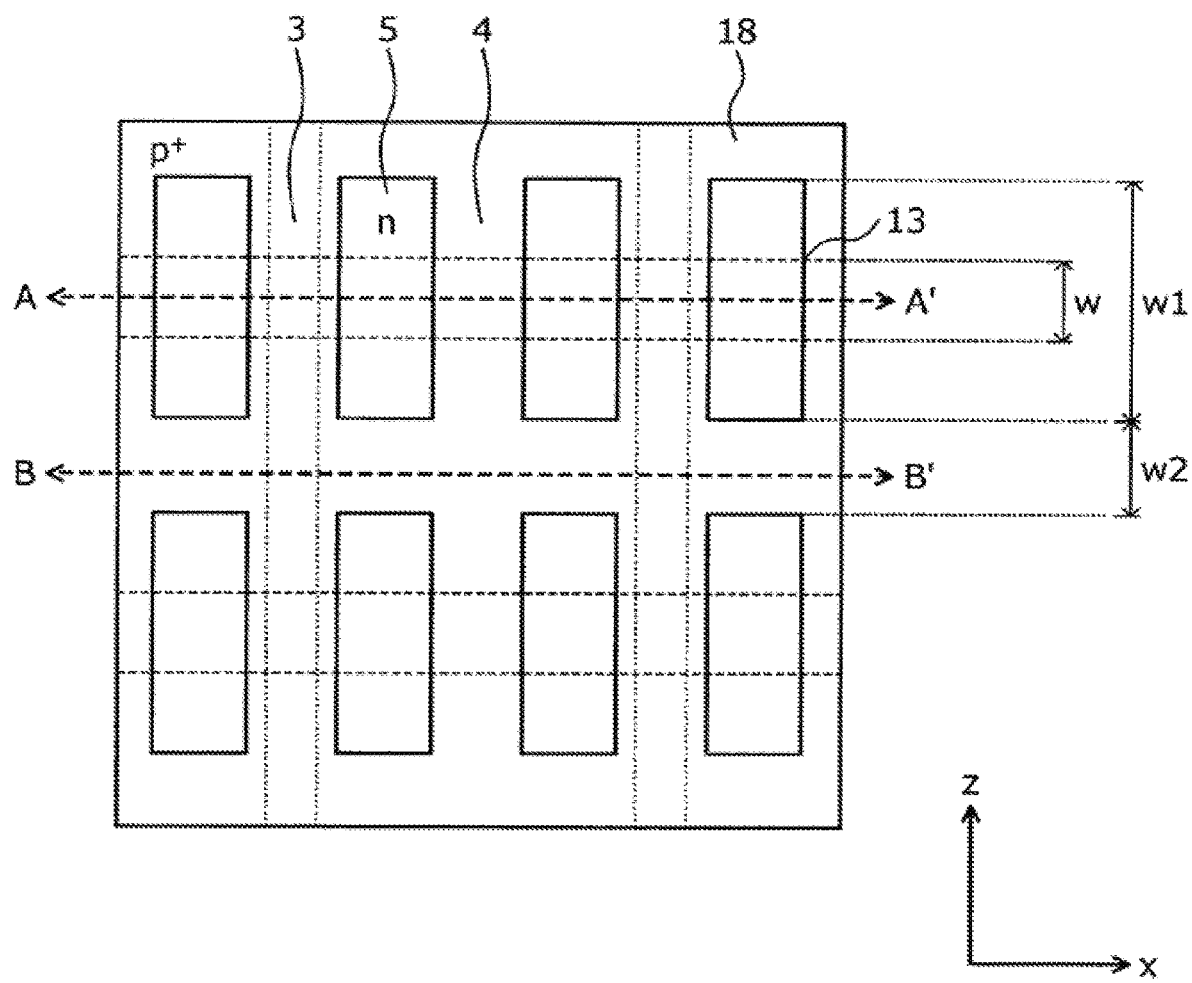
FIG. 5 is a top surface view of the D-D' portion in FIG. 2 that shows the structure of the silicon carbide semiconductor device according to the embodiment.

A semiconductor device according to the present invention is formed using a semiconductor with a wider bandgap than silicon (hereinafter, wide bandgap semiconductor). The description will use a semiconductor device using e.g. silicon carbide (SiC) (silicon carbide semiconductor device) as an example of the wide bandgap semiconductor. FIG. 1 is a perspective view showing a structure of a silicon carbide semiconductor device according to the embodiment of the present invention. FIG. 2 is a cross-sectional view of the A-A' portion in FIG. 1 that shows the structure of the silicon carbide semiconductor device according to the embodiment. FIG. 3 is a cross-sectional view of the B-B' portion in FIG. 1 that shows the structure of the silicon carbide semiconductor device according to the embodiment. FIG. 4 is a cross-sectional view of the C-C' portion in FIG. 1 that shows the structure of the silicon carbide semiconductor device according to the embodiment. FIG. 5 is a top surface view of the D-D' portion in FIG. 2 that shows the structure of the silicon carbide semiconductor device according to the embodiment.

FIGS. 1 to 3 show only two unit cells (element functional units) and omit the illustration of other unit cells adjacent to these unit cells. The silicon carbide semiconductor device according to the embodiment shown in FIGS. 1 to 4 is a vertical MOSFET that includes a MOS gate on the front surface side (a p-type base layer 6-side surface) of a semiconductor substrate body 100 made of silicon carbide (silicon carbide substrate body: semiconductor chip).

The silicon carbide substrate body 100 is formed by epitaxially growing, in the stated order, silicon carbide layers that will respectively serve as an n⁻ drift layer 2 and the p-type base layer (a second semiconductor layer of a second conductivity type) 6 on an n⁺ support substrate (a semiconductor substrate of the first conductivity type) 1 made of silicon carbide. The MOS gate is made of the p-type base layer 6, an n⁺ source region (a first semiconductor region of the first conductivity type) 7, p⁺ contact region 8, trench 18, gate insulating film 9, and gate electrode 10. Specifically, an n-type region 5 is provided on the surface layer of the n⁻ drift layer 2 on the source side (source electrode 12 side) so as to contact the p-type base layer 6. The n-type region 5 is a so-called current spreading layer (CSL) that reduces spreading resistance of the carriers. This n-type region 5 is provided uniformly in a direction parallel to the substrate body front surface (front surface of the silicon carbide substrate body 100), for example. The drift layer 2 and the n-type region 5 together constitute a first semiconductor layer of a first conductivity type provided on the substrate 1.

The inside of the n-type region 5 is selectively provided with a first p⁺ region (a third semiconductor region of the second conductivity type) 3, a second p⁺ region (a second semiconductor region of the second conductivity type) 4, and an n⁺ high concentration region (a fourth semiconductor region of the first conductivity type) 13. The first p⁺ region 3 is provided so as to contact the bottom surface of the trench 18, as described later. The first p⁺ region 3 is provided from a position that is deeper on the drain side than the interface between the p-type base layer 6 and n-type region 5 at a depth that does not reach the interface between the n-type region 5 and n⁻ drift layer 2. By providing the first p⁺ region 3, it is possible to form a pn junction near the bottom surface of the trench 18 between the first p⁺ region 3 and n-type region 5. The first p⁺ region 3 has a higher impurity concentration than the p-type base layer 6.

Furthermore, the width of the first p⁺ region 3 is the same or wider than the width of the trench 18. The bottom of the trench 18 may reach the first p⁺ region 3 or may be positioned inside the n-type region 5 interposed between the p-type base layer 6 and first p⁺ region 3. The second p⁺ region 4 is selectively provided between adjacent trenches 18 (in the mesa portion). The first p⁺ region 3 and second p⁺ region 4 have a higher impurity concentration than the p-type base layer 6, and the first p⁺ region 3 and second p⁺ region 4 are doped with aluminum (Al), for example.

By providing the first p+ region 3, it is possible to form a pn junction between the first p⁺ region 3 and n-type region 5 at a position near the bottom of the trench 18 in the depth direction (the y-axis negative direction). Forming the pn junction between the first p⁺ region 3 and n-type region 5 in this manner makes it possible to prevent the application of a high electric field to the gate insulating film 9 on the bottom of the trench 18. Due to this, it is possible to have a higher withstand voltage even in a case in which a wide bandgap semiconductor is used as the semiconductor material. Furthermore, providing the first p⁺ region 3 with a greater width than the trench width makes it possible to reduce the electric field at the corners of the trench, which is where the electric field at the bottom of the trench 18 is concentrated, and thus it is possible to further increase the withstand voltage. The first p⁺ region 3 and second p⁺ region 4 are connected as shown in FIG. 3 with the B-B' cross section in FIG. 1.

FIG. 5 is a view of the cross section of the D-D' portion in FIG. 2 seen from the source electrode 12 side. In FIG. 5, the n⁺ high concentration region 13 and trench 18 are shown with dashed lines in order to show the positional relationships of the first p⁺ region 3, second p⁺ region 4, n⁺ high concentration region 13, and trench 18. The n⁺ high concentration region 13 is provided at a position that is deeper than the first p⁺ region 3 and second p⁺ region 4, and the first p⁺ region 3 and second p⁺ region 4 are provided at a position that is deeper than the trench 18. The first p⁺ region 3 and second p⁺ region 4 are connected in the B-B' portion.

As shown in FIG. 5, the first p⁺ region 3 and second p⁺ region 4 may have structures that are formed at the same time. The n-type region 5 is disposed in strips as shown in FIG. 5. FIG. 2 is a cross-sectional view of a portion where the first p+ region 3 and second p+ region 4 are not connected, and FIG. 3 is a cross-sectional view of a portion where the first p+ region 3 and second p+ region 4 are connected. By having a structure where a portion is connected, it is possible to reduce the burden on the gate insulating film 9 and improve reliability by causing an efficient retreat to the source electrode 12 of holes generated when avalanche breakdown has occurred at the junction portion of the second p+ region 4 and n− drift layer 2.

As shown in FIG. 2 and FIG. 5, the n+ high concentration region 13 is provided at a position that is deeper than the first p+ region 3 and second p+ region 4 in a stripe shape in a direction (the x direction in FIG. 1 and FIG. 5) that is perpendicular to the lengthwise direction of the trench 18 (the z direction in FIG. 1 and FIG. 5). For example, the surface of the n+ high concentration region 13 on the source side (source electrode 12 side) contacts the surfaces of the first p+ region 3 and second p+ region 4 on the substrate side, as shown in FIG. 2. Furthermore, as shown in FIG. 4, the top surface of the n+ high concentration region 13 is shallower than the boundary between the second p+ region 4 and n-type region 5 (the bottom of the second p+ region 4 over the n-type region 5).

The n+ high concentration region 13 has a higher impurity concentration than the n− drift layer 2 and n-type region 5, and a width w of the n+ high concentration region 13 is around 1 μm to 63 μm, for example, and a depth h from the bottom of the second p+ region 4 is around 0.2 μm. The n+ high concentration region 13 is provided in the center of the strip-like n-type region 5, as shown in FIG. 5. A width w1 of the n-type region 5 is around 63 μm, and thus the width w of the n+ high concentration region 13 is 63 μm or below. If the width w is too narrow, then it will be difficult to form the n+ high concentration region 13, and thus a width of at least 1 μm is preferable. An interval w2 between the strip-like n-type regions 5 is at least 1 μm, for example.

By providing this type of n+ high concentration region 13, the low-resistance n+ high concentration region 13 widens the range where current can flow and allows current to flow up to a position separated from the trench gate structure, thus making it possible to reduce electric field concentration at the bottom of the trench 18. Due to this, the withstand voltage of the active section where current flows during the ON state is lowered and thereby the withstanding ability of the semiconductor device is improved. Furthermore, it is possible to eliminate avalanches at the bottom of the trench 18 to lower the load on the trench 18, and it is possible to improve the reliability of the semiconductor device. In addition, by providing the n+ high concentration region 13 in the direction perpendicular to the lengthwise direction of the trench 18, the n+ high concentration region 13 will be positioned below the first p+ region 3 and second p+ region 4, and thus pattern deviations will be eliminated. Due to this, it is possible to eliminate products that are defective due to pattern deviations, and the yield of the manufacturing of semiconductor devices is improved.

Moreover, the inside of the p-type base layer 6 is selectively provided with the n+ source region 7 and p+ contact region 8 such that these regions contact each other. The depth of the p+ contact region 8 may be the same depth as the n+ source region 7 or may be deeper than the n+ source region 7, for example.

The trench 18 reaches from the substrate body main surface, through the n+ source region 7 and p-type base layer 6, to the n-type region 5. The inside of the trench 18 is provided with the gate insulating film 9 along the side walls of the trench 18, and the gate electrode 10 is provided on the inner side of the gate insulating film 9. The source side end of the gate electrode 10 may protrude to outside from the substrate body front surface, but this is not necessary. The gate electrode 10 is electrically connected to a gate pad (not shown) at a portion omitted in the drawings. An interlayer insulating film 11 is provided on the entire surface of the substrate body front surface so as to cover the gate electrode 10 filled into the trench 18.

The source electrode 12 contacts the n+ source region 7 and p+ contact region 8 via a contact hole in the interlayer insulating film 11 and is electrically insulated from the gate electrode 10 by the interlayer insulating film 11. A barrier metal may be provided between the source electrode 12 and interlayer insulating film 11 to prevent the diffusion of metal atoms from the source electrode 12 to the gate electrode 10, for example. A source electrode pad (not shown) is provided on the source electrode 12. A drain electrode (not shown) is provided on the rear surface of the silicon carbide substrate body 100 (the rear surface of the n+ silicon carbide substrate 1 serving as the n+ drain region).

(Method of Manufacturing Semiconductor Device of Embodiment)

Figure 6:
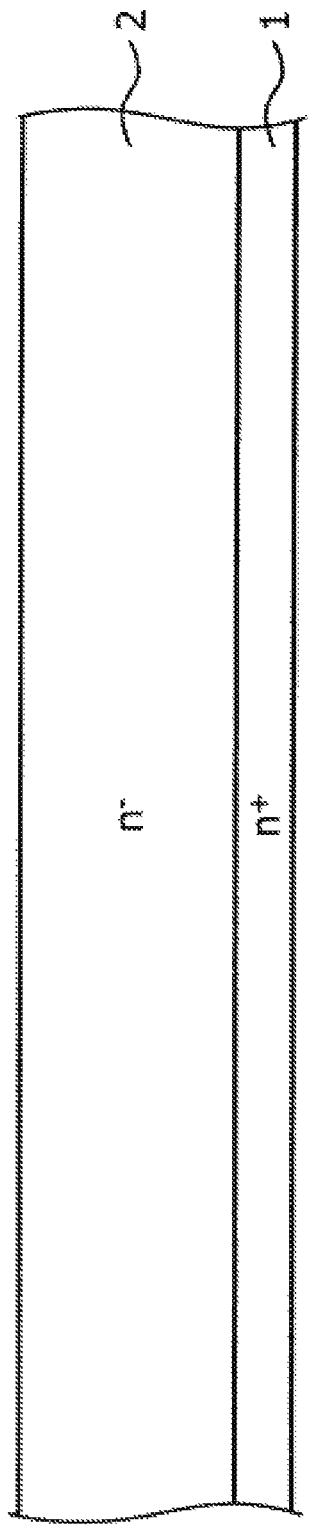
FIG. 6 is a first cross-sectional view of the silicon carbide semiconductor device according to the embodiment during manufacturing.

Next, a method of manufacturing the semiconductor device according to the embodiment will be described. FIGS. 6 to 12 are cross-sectional views of the silicon carbide semiconductor device of the embodiment during the manufacturing thereof. First, the n+ silicon carbide substrate 1, which will serve as the n+ drain region, is prepared. Next, the n− drift layer 2 described above is epitaxially grown on the front surface of the n+ silicon carbide substrate 1. The conditions of the epitaxial growth for forming the n− drift layer 2 may be set such that the impurity concentration of the n− drift layer 2 is around $1 \times 10^{16}/cm^3$, for example. This state is shown in FIG. 6.

Next, a bottom n-type region 5a is epitaxially grown on the n− drift layer 2. The conditions of the epitaxial growth for forming the bottom n-type region 5a may be set such that the impurity concentration of the bottom n-type region 5a is around $1 \times 10^{17}/cm^3$, for example. This bottom n-type region 5a is a part of the n-type region 5. Next, photolithography and ion implantation of n-type impurities are used to selectively form the n+ high concentration region 13 in the surface layer of the bottom n-type region 5a. The dosage amount during the ion implantation for forming the n+ high concentration region 13 may be set such that the impurity concentration is around $4 \times 10^{17}/cm^3$, for example. This state is shown in FIG. 7A and FIG. 7B. FIG. 7A is a cross-sectional view of the A-A' portion in FIG. 1, and FIG. 7B is a cross-sectional view of the B-B' portion in FIG. 1.

Figure 8A:
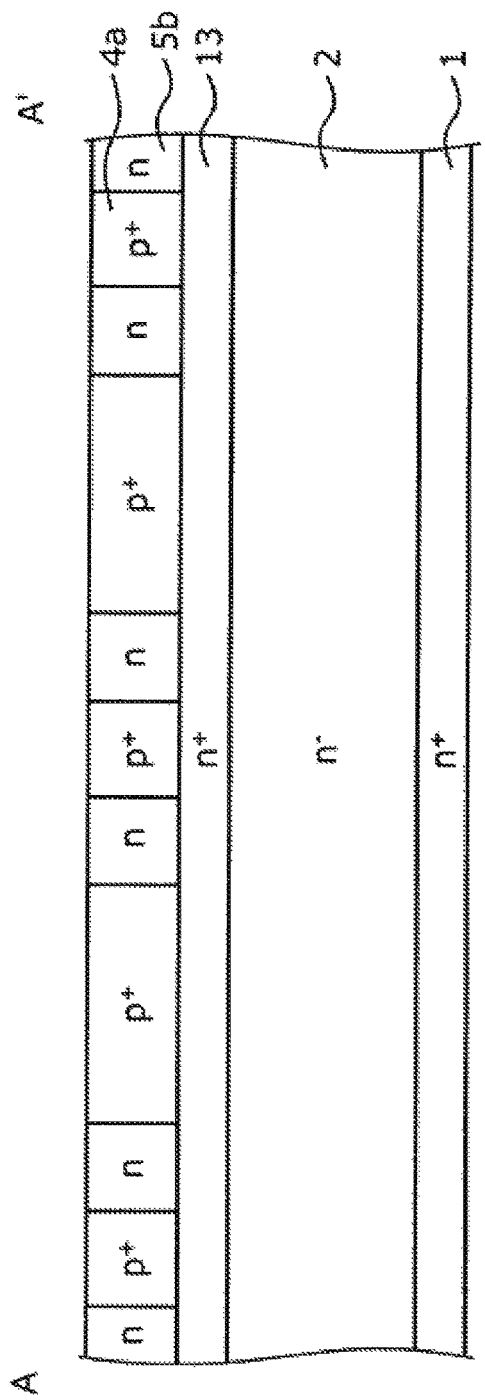
FIG. 8A is a fourth cross-sectional view of the silicon carbide semiconductor device according to the embodiment during manufacturing.
Figure 8B:
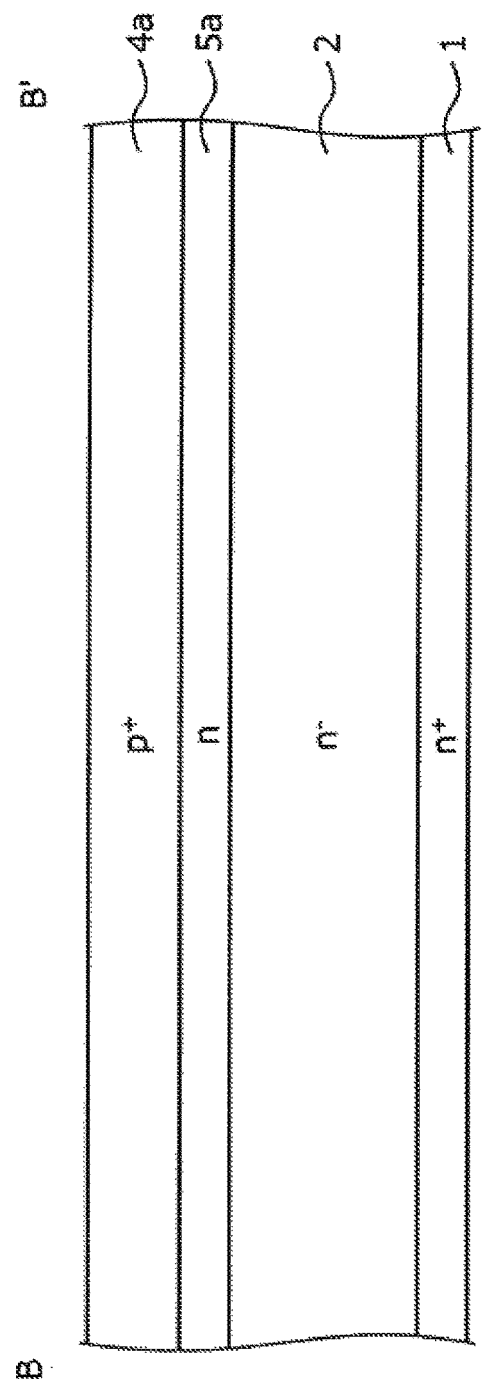
FIG. 8B is a fifth cross-sectional view of the silicon carbide semiconductor device according to the embodiment during manufacturing.

Next, a middle n-type region 5b is epitaxially grown on the bottom n-type region 5a and n+ high concentration region 13. The conditions of the epitaxial growth for forming the middle n-type region 5b may be set such that the impurity concentration is around the same as the impurity concentration of the bottom n-type region 5a. This middle n-type region 5b is a part of the n-type region 5. Next, photolithography and ion implantation of p-type impurities are used to selectively form a bottom second p+ region 4a in the surface layer of the middle n-type region 5b. This bottom second p+ region 4a is a part of the first p+ region 3 and second p+ region 4. The dosage amount during the ion implantation for forming the bottom second p+ region 4a may be set such that the impurity concentration is around $5 \times 10^{18}/cm^3$, for example. This state is shown in FIG. 8A and FIG. 8B. FIG. 8A is a cross-sectional view of the A-A' portion in FIG. 1, and FIG. 8B is a cross-sectional view of the B-B' portion in FIG. 1.

Next, a top n-type region 5c is epitaxially grown on the middle n-type region 5b and bottom second p+ region 4a. The conditions of the epitaxial growth for forming the top n-type region 5c may be set such that the impurity concentration is around the same as the impurity concentration of the bottom n-type region 5a. This top n-type region 5c is a part of the n-type region 5. The bottom n-type region 5a, middle n-type region 5b, and top n-type region 5c collectively serve as the n-type region 5. Next, photolithography and ion implantation of p-type impurities are used to selectively form a top second p+ region 4b in the surface layer of the top n-type region 5c. This top second p+ region 4b combines with a portion of the bottom second p+ region 4a to serve as the second p+ region 4. The bottom second p+ region 4a that is not combined with the top second p+ region 4b serves as the first p+ region 3. The dosage amount during the ion implantation for forming the top second p+ region 4b may be set such that the impurity concentration is about the same as the impurity concentration of the bottom second p+ region 4a. This state is shown in FIG. 9A and FIG. 9B. FIG. 9A is a cross-sectional view of the A-A' portion in FIG. 1, and FIG. 9B is a cross-sectional view of the B-B' portion in FIG. 1.

Next, the p-type base layer 6 is epitaxially grown on the top n-type region 5b and top second p+ region 4b. The conditions of the epitaxial growth for forming the p-type base layer 6 are set such that the impurity concentration of the p-type base layer 6 is around $2 \times 10^{17}/cm^3$, for example. The sections formed after this are the same in both the cross section of the A-A' portion and the cross section of the B-B' portion, and thus only the cross-sectional view of the B-B' portion in FIG. 1 will be shown.

Figure 10:
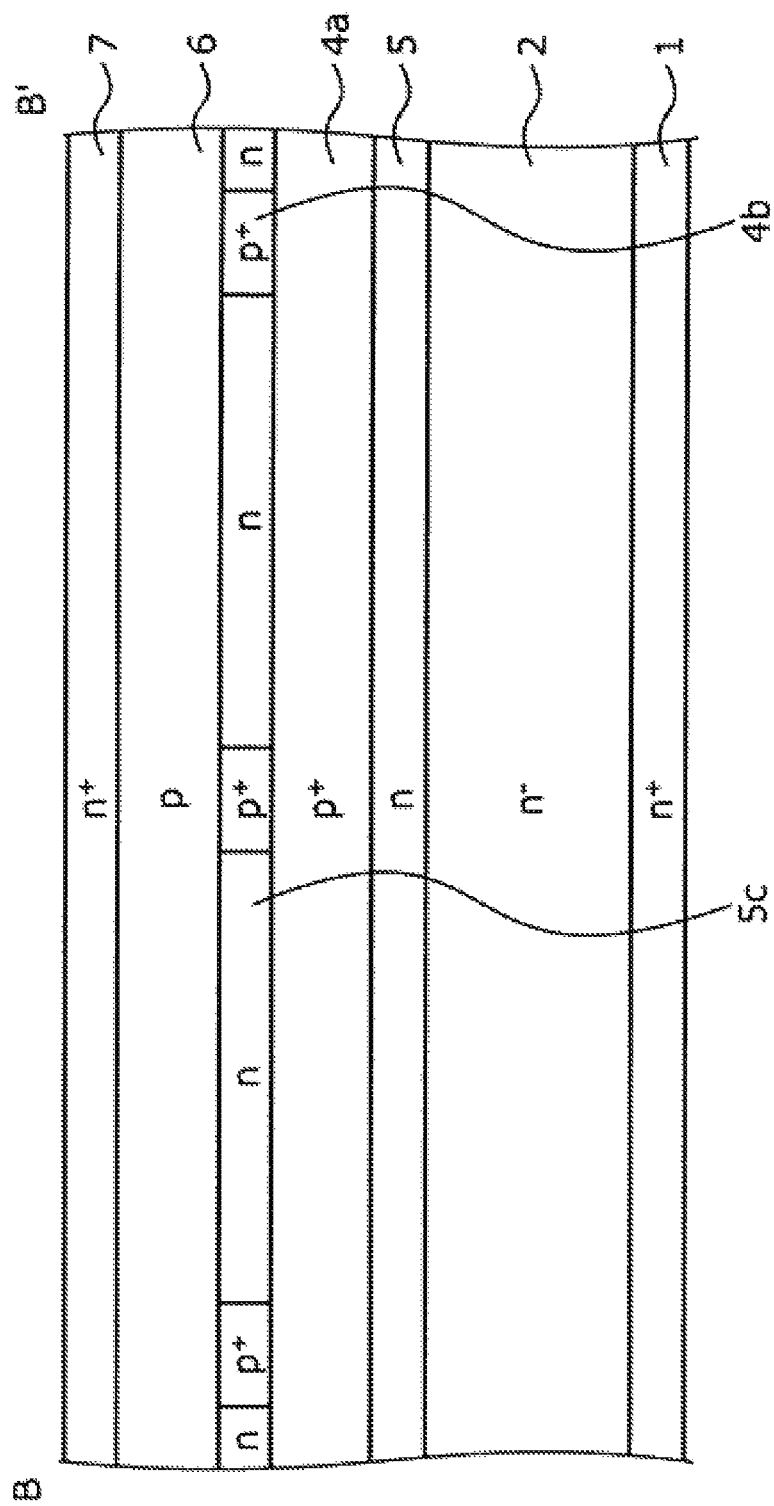
FIG. 10 is an eighth cross-sectional view of the silicon carbide semiconductor device according to the embodiment during manufacturing.

Next, photolithography and ion implantation of n-type impurities are used to selectively form the n+ source region 7 in the surface layer of the p-type base layer 6. The dosage amount during the ion implantation for forming the n+ source region 7 may be set such that the impurity concentration is around $3 \times 10^{20}/cm^3$, for example. This state is shown in FIG. 10.

Figure 11:
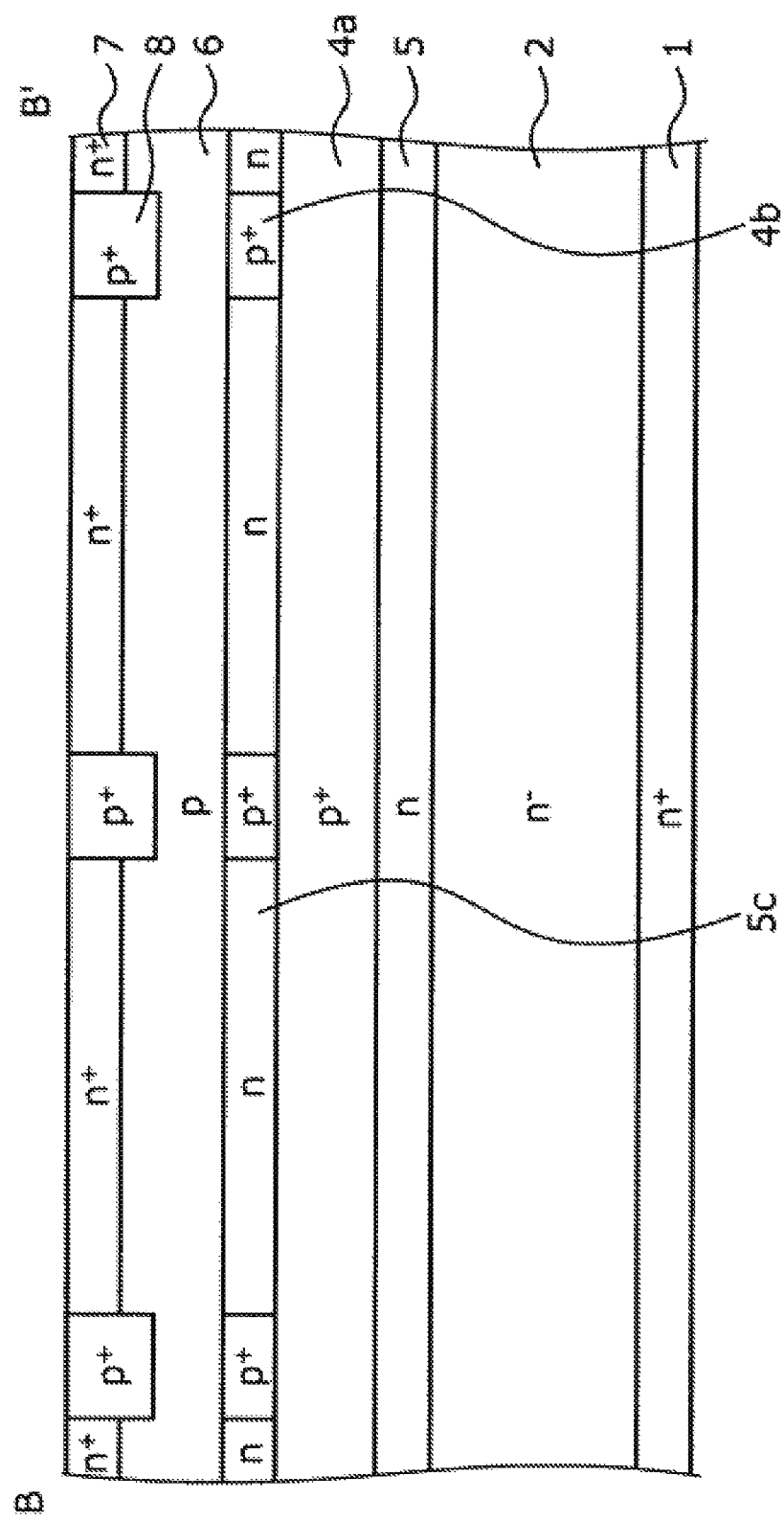
FIG. 11 is a ninth cross-sectional view of the silicon carbide semiconductor device according to the embodiment during manufacturing.

Next, photolithography and ion implantation of p-type impurities are used to selectively form the p+ contact region 8 in the surface layer of the p-type base layer 6 so as to contact the n+ source region 7. The dosage amount during the ion implantation for forming the p+ contact region 8 may be set such that the impurity concentration is around $3 \times 10^{20}/cm^3$, for example. The formation order of the n+ source region 7 and p+ contact region 8 may be switched. After all ion implantations are finished, activation annealing is performed. This state is shown in FIG. 11.

Figure 12:
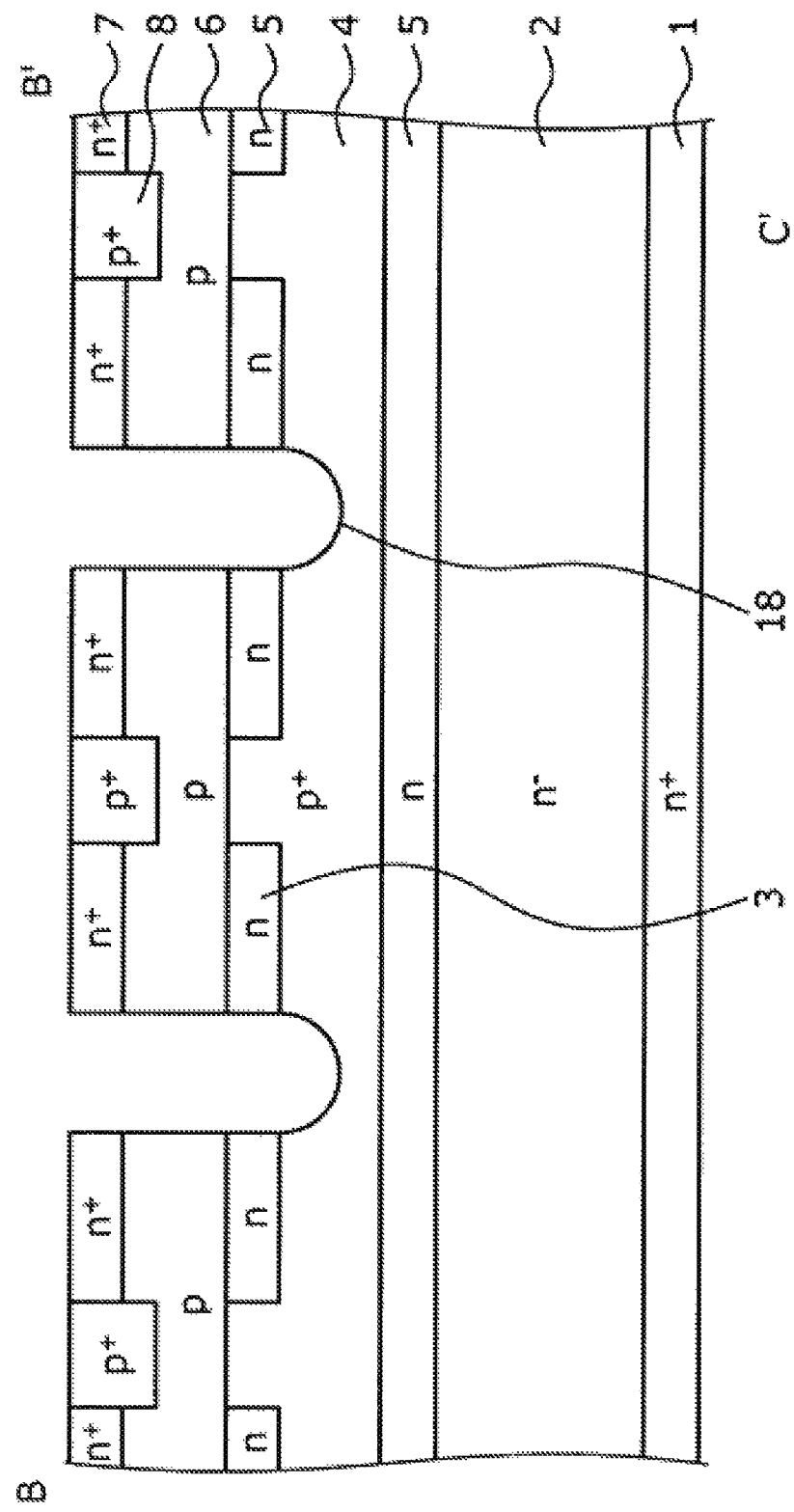
FIG. 12 is a tenth cross-sectional view of the silicon carbide semiconductor device according to the embodiment during manufacturing.
Figure 13:
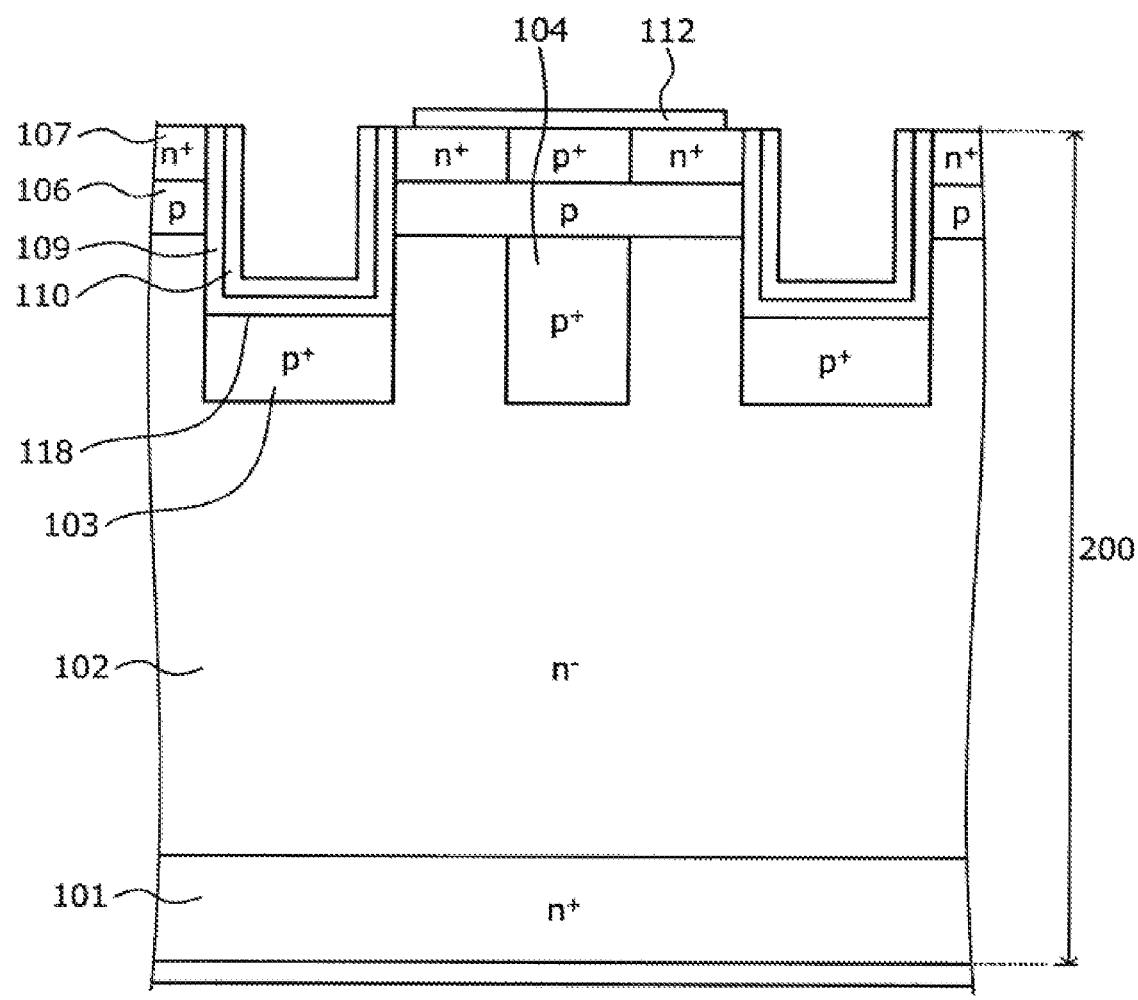
FIG. 13 is a cross-sectional view showing a structure of a conventional silicon carbide semiconductor device.

Next, photolithography and etching are used to form the trench 18 going through the n+ source region 7 and p-type base region 6 and reaching the n-type region 5. An oxide film is used as the mask during forming of the trench. After the trench etching, isotropic etching for removing damage to the trench 18 and hydrogen annealing for rounding the corners of the bottom of the trench 18 and the opening of the trench 18 may be performed. Both or only one of the isotropic etching and hydrogen annealing may be performed. Furthermore, the hydrogen annealing may be performed after the isotropic etching. This state is shown in FIG. 12.

Next, the gate insulating film 9 is formed on the front surface of the silicon carbide substrate body 100 and along the inner walls of the trench 18. Next, polysilicon, for example, is deposited so as to fill in the trench 18 and etched in order to leave polysilicon, inside the trench 18, that will serve as the gate electrode 10. At such time, etch-back may be performed such that the polysilicon is etched so as to remain on the inner side of the substrate body front section, or patterning and etching may be performed such that the polysilicon protrudes outside from the substrate body front section.

Next, the interlayer insulating film 11 is formed on the entire surface of the front surface of the silicon carbide substrate body 100 so as to cover the gate electrode 10. The interlayer insulating film 11 may be formed of NSG (non-doped silicate glass), PSG (phosphosilicate glass), BPSG (borophosphosilicate glass), HTO (high temperature oxide), or a combination of these, for example. Next, the interlayer insulating film 11 and gate insulating film 9 are patterned to form the contact hole, and the n+ source region 7 and p+ contact region 8 are exposed.

Next, a barrier metal is formed so as to cover the interlayer insulating film 11 and patterned, and the n+ source region 7 and p+ contact region are exposed again. Next, the source electrode 12 is formed so as to contact the n+ source region 7. The source electrode 12 may be formed so as to cover the barrier metal or may remain only inside the contact hole.

Next, the source electrode pad is formed so as to fill in the contact hole. A portion of the metal layer deposited in order to form the source electrode pad may serve as the gate pad. A metal film such as a nickel (Ni) film or titanium (Ti) film is formed on the rear surface of the n+ silicon carbide substrate 1 by using sputter deposition or the like on the contact part of the drain electrode. This metal film may be laminated by combining together a plurality of Ni films or Ti films. Thereafter, annealing such as rapid thermal annealing (RTA) is performed so as to silicide the metal film and form an ohmic contact. After this, a thick film such as a laminate film obtained by laminating a Ti film, Ni film, and gold (Au) in this order, for example, is formed by electron beam (EB) deposition or the like to form the drain electrode.

In the aforementioned epitaxial growth and ion implantation, the n-type impurity (n-type dopant) may be nitrogen (N), phosphorous (P), arsenic (As), antimony (Sb), etc., which are n-type relative to silicon carbide, for example. The p-type impurity (p-type dopant) may be boron (B), aluminum (Al), gallium (Ga), indium (In), tellurium (Tl), etc., which are p-type relative to silicon carbide, for example. This completes the MOSFET shown in FIGS. 1 to 4.

As described above, according to the embodiment, the n+ high concentration region is provided at a position that is deeper than the first p+ region and second p+ region in a direction that is perpendicular to the lengthwise direction of the trench. This widens the range where current flows, and allows current to flow up to a position separated from the trench gate structure, which makes it possible to reduce the electric field concentration at the bottom of the trench. Due to this, the withstand voltage of the active section is lowered and thereby the withstanding ability of the semiconductor device is improved. Furthermore, it is possible to eliminate avalanches at the bottom of the trench to lower the load on the trench, and thus it is possible to improve the reliability of the semiconductor device. In addition, pattern deviations are eliminated, which makes it possible to eliminate products that are defective due to pattern deviations, and it is possible to improve the yield of the manufacturing of semiconductor devices.

As described above, in the present invention, an example was described for a case where a MOS gate structure was formed on a first main surface of a silicon substrate, but the present invention is not limited to this, and various modifications can be made, such as to the type of semiconductor (for example, silicon carbide (SiC), etc.), to the plane orientation of the substrate main surface, or the like. Furthermore, in the respective embodiments of the present invention, the first conductivity type was n-type, and the second conductivity type was p-type, but the present invention is applicable even when the first conductivity type is p-type and the second conductivity type is n-type.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

Industrial Applicability

As described above, the semiconductor device of the present invention is useful for high withstand voltage semiconductor devices used in power supply devices in various types of industrial machinery and power conversion devices, for example.

What is claimed is:

1. A semiconductor device, comprising:
   a semiconductor substrate of a first conductivity type;
   a first semiconductor layer of the first conductivity type provided in a front surface of the semiconductor substrate and having a lower impurity concentration than the semiconductor substrate;
   a second semiconductor layer of a second conductivity type provided on a side of the first semiconductor layer opposite to the semiconductor substrate;
   a first semiconductor region of the first conductivity type selectively provided inside the second semiconductor layer and having a higher impurity concentration than the semiconductor substrate;
   a trench going through the first semiconductor region and the second semiconductor layer and reaching the first semiconductor layer;
   a gate electrode provided inside the trench with a gate insulating film interposed between the gate electrode and the trench;
   a second semiconductor region of the second conductivity type selectively provided inside the first semiconductor layer;
   a third semiconductor region of the second conductivity type selectively provided inside the first semiconductor layer and contacting a bottom surface of the trench; and
   a fourth semiconductor region of the first conductivity type selectively provided inside the first semiconductor layer and having a higher impurity concentration than the first semiconductor layer,
   wherein in a plan view, the fourth semiconductor region has an elongated shape extending in a direction perpendicular to a lengthwise direction of the trench, and in a depth direction, the fourth semiconductor regions is located at a position deeper than the second semiconductor region.

2. The semiconductor device according to claim 1, wherein the second semiconductor region is connected to a portion of the third semiconductor region by having a lateral extension towards the trench.

3. The semiconductor device according to claim 2, wherein an upper surface of the fourth semiconductor region contacts a portion of a bottom surface of the second semiconductor region.

4. The semiconductor device according to claim 3, wherein a portion of the bottom surface of the second semiconductor region that is not in contact with the upper surface of the fourth semiconductor region is deeper than the portion of the bottom surface that is in contact with the upper surface of the fourth semiconductor region, thereby creating a stepwise bottom profile of the second semiconductor region.

5. The semiconductor device according to claim 2,
   wherein the first semiconductor layer comprises a drift layer of the first conductivity type and a current spreading layer of the first conductivity type on the drift layer,
   wherein the forth semiconductor region is in a bottom layer of the current spreading layer that is in contact with the drift layer underneath, and
   wherein the second and third semiconductor regions of the second conductivity type are both provided in the current spreading layer.

6. The semiconductor device according to claim 1, wherein an upper surface of the fourth semiconductor region contacts a portion of a bottom surface of the second semiconductor region.

7. The semiconductor device according to claim 6, wherein a portion of the bottom surface of the second semiconductor region that is not in contact with the upper surface of the fourth semiconductor region is deeper than the portion of the bottom surface that is in contact with the upper surface of the fourth semiconductor region, thereby creating a stepwise bottom profile of the second semiconductor region.

8. The semiconductor device according to claim 7,
   wherein the first semiconductor layer comprises a drift layer of the first conductivity type and a current spreading layer of the first conductivity type on the drift layer,
   wherein the forth semiconductor region is in a bottom layer of the current spreading layer that is in contact with the drift layer underneath, and
   wherein the second and third semiconductor regions of the second conductivity type are both provided in the current spreading layer.

9. The semiconductor device according to claim 6,
   wherein the first semiconductor layer comprises a drift layer of the first conductivity type and a current spreading layer of the first conductivity type on the drift layer,
   wherein the forth semiconductor region is in a bottom layer of the current spreading layer that is in contact with the drift layer underneath, and
   wherein the second and third semiconductor regions of the second conductivity type are both provided in the current spreading layer.

10. The semiconductor device according to claim 1,
    wherein the first semiconductor layer comprises a drift layer of the first conductivity type and a current spreading layer of the first conductivity type on the drift layer,
    wherein the forth semiconductor region is in a bottom layer of the current spreading layer that is in contact with the drift layer underneath, and
    wherein the second and third semiconductor regions of the second conductivity type are both provided in the current spreading layer.

* * * * *